(12) United States Patent
Lin

(10) Patent No.: US 8,605,772 B2
(45) Date of Patent: Dec. 10, 2013

(54) TRANSCEIVER SYSTEM HAVING PHASE AND FREQUENCY DETECTOR AND METHOD THEREOF

(75) Inventor: Ying-Chen Lin, Xindian (TW)

(73) Assignee: Genesys Logic, Inc., Shindian, Taipei (TW)

( * ) Notice: Subject to any disclaimer, the term of this patent is extended or adjusted under 35 U.S.C. 154(b) by 580 days.

(21) Appl. No.: 12/877,859

(22) Filed: Sep. 8, 2010

(65) Prior Publication Data

US 2012/0049909 A1 Mar. 1, 2012

(30) Foreign Application Priority Data

Aug. 24, 2010 (TW) ................. 99128260 A

(51) Int. Cl.
*H04L 5/16* (2006.01)
*H04B 1/38* (2006.01)

(52) U.S. Cl.
USPC ........................................ 375/219

(58) Field of Classification Search
USPC .................. 375/219, 326, 316, 295
See application file for complete search history.

(56) References Cited

U.S. PATENT DOCUMENTS

| 6,215,835 | B1 * | 4/2001 | Kyles ............................. 375/376 |
| 7,460,589 | B2 | 12/2008 | Fujimori et al. |
| 7,760,840 | B2 | 7/2010 | Chang |
| 8,165,258 | B2 * | 4/2012 | Weng et al. ................... 375/376 |
| 2009/0161738 | A1 * | 6/2009 | Carvalho et al. .............. 375/219 |

FOREIGN PATENT DOCUMENTS

| EP | 1408641 B1 | 9/2006 |
| TW | 200708919 A | 3/2007 |

OTHER PUBLICATIONS

Haris S. Muthali, Thomas P. Thimas, Ian A. Young; A CMOS 10-Gb/s SONET Transceiver; journal; Sep. 2003; 281-284; Unknown; Solid State Circuits Conference, 2003. ESSCIRC '03; European.

* cited by examiner

Primary Examiner — Ted Wang

(57) ABSTRACT

A transceiver system having a phase and frequency locked architecture is described. The transceiver system includes a clock and data recovery type receiver, a frequency divider and a transmitter. The clock and data recovery type receiver receives an external signal from a host unit and extracts the external signal to generate a clock signal and a data signal. The frequency divider is used to divide the frequency of the clock signal for generating a reference clock signal. The transmitter transmits output data content based on the reference clock signal.

15 Claims, 7 Drawing Sheets

TRANSCEIVER SYSTEM HAVING PHASE AND FREQUENCY DETECTOR AND METHOD THEREOF

CLAIM OF PRIORITY

This application claims priority to Taiwanese Patent Application No. 099128260 filed on Aug. 24, 2010.

FIELD OF THE INVENTION

The present invention relates to a transceiver system and method thereof, and more particularly to a transceiver system having phase and frequency detector and method thereof.

BACKGROUND OF THE INVENTION

In electronic data processing system, the data transmission and data receiving are operated on the basis of a crystal reference clock "REF", as shown in FIG. 1. FIG. 1 is a schematic block diagram of a conventional transceiver system 100 having an external oscillation reference clock. The transceiver system 100 includes a clock/data recovery type receiver 102, a crystal oscillator 104 and a transmitter 106. The clock/data recovery type receiver 102 receives an external signal "EX" having a transmitted frequency. That is, the external signal "EX" is issued to the clock/data recovery type receiver 102 at the transmitted frequency and the crystal oscillator 104 provides the frequency signal to the clock/data recovery type receiver 102 and the transmitter 106. It is required that the crystal reference clock "REF" is equal to the transmitted frequency of the external signal "EX" to allow the clock/data recovery type receiver 102 to accurately receive the external signal "EX". That is, after the oscillating reference clock provided from the crystal oscillator 104 to the clock/data recovery type receiver 102 is locked to the transmitted frequency, the clock/data recovery type receiver 102 starts to receive the external signal "EX". However, the frequency lock procedure need to be operated by a plurality of detection circuits but the detection circuits cannot precisely lock to the transmitted frequency of the external signal "EX" so that the usage flexibility of operating frequency of the clock/data recovery type receiver 102 are extremely restricted. In other words, it is necessary to disadvantageously narrow down the frequency percentage between the oscillating reference clock and the transmitted frequency to a "tight" value±0.5% for locking the external signal "EX" by the clock/data recovery type receiver 102 to generate the clock signal and the data signal and transmit the output data via the transmitter 106. Additionally, it is required to install the crystal oscillator 104 into the transceiver system 100 for generating the oscillating reference clock, which increases the cost. Consequently, there is a need to develop a novel transceiver system to solve the aforementioned problems.

SUMMARY OF THE INVENTION

The first objective of the present invention provides a transceiver system having phase and frequency detector and method thereof for extracting a clock signal of the external signal to be a reference clock for simplifying the circuit design of the transceiver system and saving the manufacturing cost.

The second objective of the present invention provides a transceiver system having phase and frequency detector and method thereof for locking the frequency and phase of the external signal by a clock/data recovery type receiver so that the transceiver system further adjusts the frequency difference between the voltage-controlled oscillation signals and the external signal to an operable value for the receiver to improve the usage flexibility of the transceiver system.

According to the above objectives, the present invention sets forth a transceiver system having phase and frequency detector and method thereof. The transceiver system includes a clock/data recovery type receiver, a dividing unit and transmitter. The clock/data recovery type receiver receives an external signal (S_EXT) from the host unit and extracts the external signal (S_EXT) for generating a clock signal (S_CLK) and a data signal (S_DAT). The dividing unit performs the frequency division on the clock signal (S_CLK) for generating a reference clock (S_REF) to reduce the frequency of the clock signal (S_CLK) or make a frequency multiplication of the clock signal (S_CLK). The transmitter transmits the output data content (S_OUT) to the host unit based on the reference clock (S_REF).

In the present invention, the transmitter employs the clock/data recovery type receiver to generate a clock signal (S_CLK) which serves as a reference clock (S_REF) for outputting the output data content (S_OUT). In the prior art, an additional crystal oscillator is used to generate the oscillation reference clock, which is inaccurate, complicated and high cost. The transceiver system having frequency and phase detector extracts a clock signal (S_CLK) by receiving an external signal (S_EXT) to simplify the circuit design of the transceiver system and save the manufacturing cost.

The clock/data recovery type receiver further includes a comparing unit, a phase detector, a frequency detector, a loop filter, a switching unit, a digital-to-analog converter (DAC), a voltage-controlled oscillator (VCO) and an adjusting device. The comparing unit samples the external signal (S_EXT) based on a sampling frequency (S_SFRE) for generating the data signal (S_DAT) and a sampling signal (S_SAM). The phase detector detects a phase variation between a first voltage-controlled oscillation signal (S_VCO1) and the sampling signal (S_SAM) for generating a first phase difference signal (S_PH1), and detects the phase variation between a second voltage-controlled oscillation signal (S_VCO2) and the sampling signal (S_SAM) for generating a second phase difference signal (S_PH2). The frequency detector detects a frequency of the first phase difference signal (S_PH1) for generating a first frequency difference signal (S_FRE1). The frequency detector further adjusts the first voltage-controlled oscillation signal (S_VCO1) for controlling the second voltage-controlled oscillation signal (S_VCO2) and the frequency detector detects a frequency of the second phase difference signal (S_PH2) for generating a second frequency difference signal (S_FRE2).

The adjusting device compares the first frequency difference signal (S_FRE1) with the second frequency difference signal (S_FRE2) wherein when the second frequency difference signal (S_FRE2) is smaller than the first frequency difference signal (S_FRE1), the second frequency difference signal (S_FRE2) is continuously decreased to a minimum frequency difference (S_FMIN), and when the second frequency difference signal (S_FRE2) is greater than the first frequency difference signal (S_FRE1), the first frequency difference signal (S_FRE1) is continuously decreased to the minimum frequency difference.

The voltage-controlled oscillator generates the first voltage-controlled oscillation signal (S_VCO1) and generates the second voltage-controlled oscillation signal (S_VCO2) when the frequency detector 304 adjusts the frequency of the voltage-controlled oscillator 312 based on the first frequency difference signal (S_FRE1), wherein one of the first voltage-controlled oscillation signal (S_VCO1) and the second voltage-controlled oscillation signal (S_VCO2) is equalized to a transmitted frequency of the external signal (S_EXT) based on the first frequency difference signal (S_FRE1) and the second frequency difference signal (S_FRE2). In one embodiment, the voltage-controlled oscillator directly issues the signal at a frequency of 10 GHz to the comparing unit or issues the approximate transmitted frequency of external signal to the comparing unit. In another case, the sampling frequency or the approximate transmitted frequency with multi-phase is issued to the comparing unit at a plurality of unit frequency. The switching unit is utilized to switch one of the frequency detector and phase detector to be electrically connected to the voltage-controlled oscillator.

The transceiver system having phase and frequency detector and method thereof for extracting a clock signal of the external signal for simplifying the circuit design of the transceiver system. The transceiver system having phase and frequency detector and method thereof locks a frequency and phase of the external signal by a receiver so that the absolute value of frequency difference between the voltage-controlled oscillation signals and the external signal is in a loose range and the clock/data recovery type receiver is capable of adjusting the starting frequency precision of the voltage-controlled oscillation signal to an operable range for extracting the external signal.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DETAILED DESCRIPTION OF THE PREFERRED EMBODIMENTS

Figure 2:
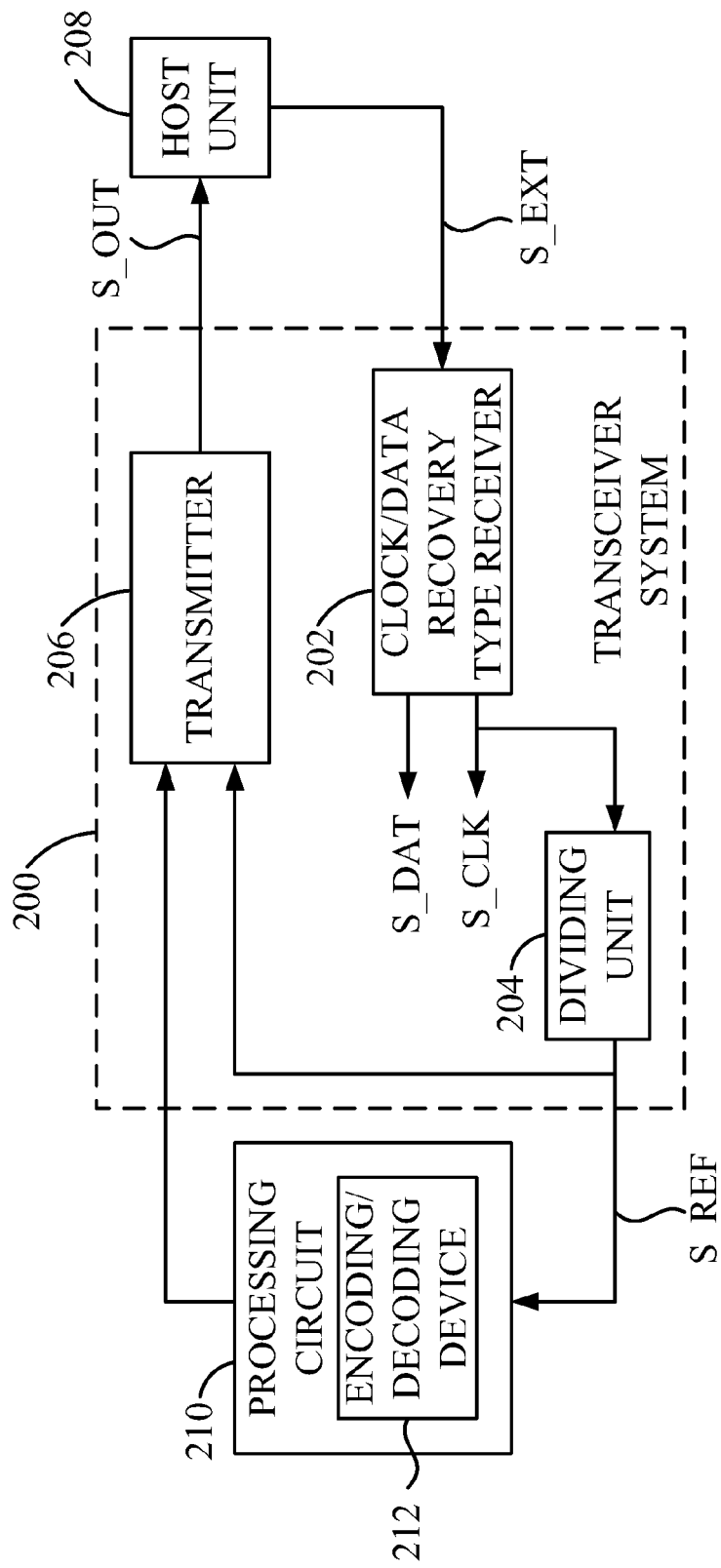
FIG. 2 is a schematic block diagram of a transceiver system having a built-in reference clock according to one embodiment of the present invention.

FIG. 2 is a schematic block diagram of a transceiver system 200 having a built-in reference clock according to one embodiment of the present invention. The transceiver system 200 couples the host unit 208 to the processing circuit 210 for receiving an external signal (S_EXT) of the host unit 208. After the signal is processed by the processing circuit 210, the processing circuit 210 returns the output data content (S_OUT) to the host unit 208 based on the reference clock (S_REF). The transceiver system 200 includes a clock/data recovery type receiver 202, a dividing unit 204 and transmitter 206. The clock/data recovery type receiver 202 is coupled to the host unit 208 and the dividing unit 204 is coupled to the clock/data recovery type receiver 202. The transmitter 206 is coupled to the dividing unit 204 and the processing circuit 210. The dividing unit 204 is coupled to the processing circuit 210.

The clock/data recovery type receiver 202 receives an external signal (S_EXT) from the host unit 208 and extracts the external signal (S_EXT) for generating a clock signal (S_CLK) and a data signal (S_DAT). The dividing unit 204 performs the frequency division on the clock signal (S_CLK) for generating a reference clock (S_REF) to reduce the frequency of the clock signal (S_CLK) or make a frequency multiplication of the clock signal (S_CLK). The transmitter 206 transmits the output data content (S_OUT) to the host unit 208 based on the reference clock (S_REF).

Figure 1:
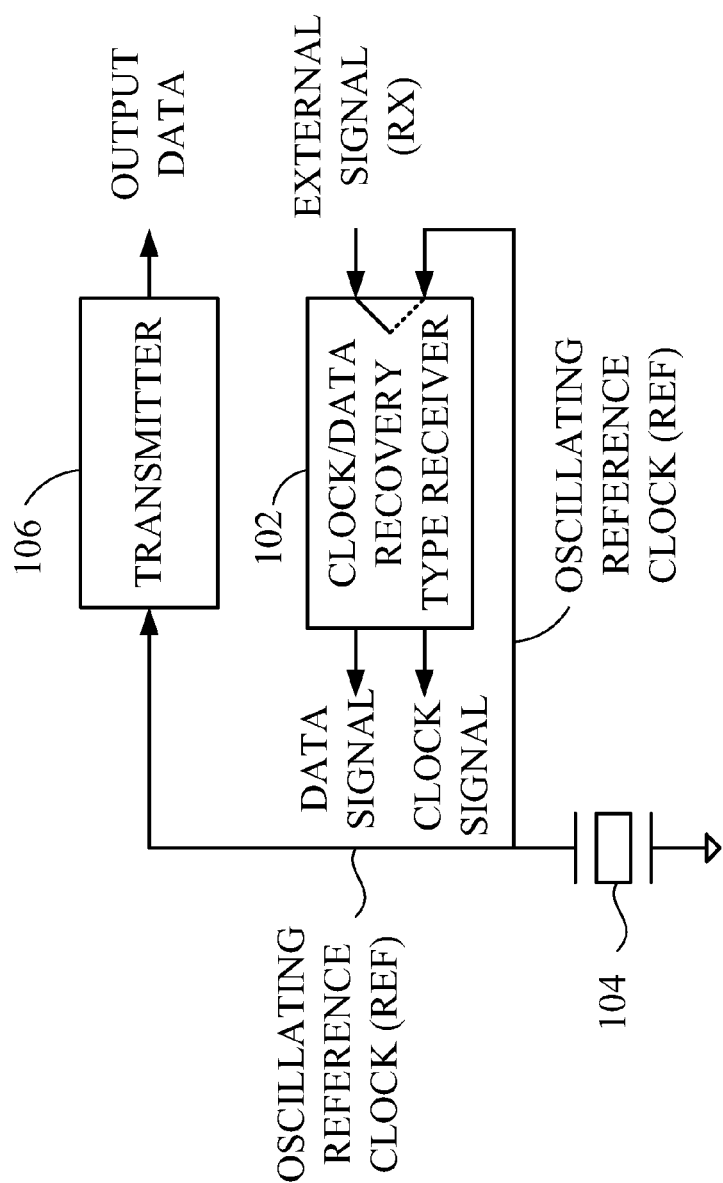
FIG. 1 is a schematic block diagram of a conventional transceiver system having an external oscillation reference clock.

In the present invention, the transmitter 206 employs the clock/data recovery type receiver 202 to generate a clock signal (S_CLK) which serves as a reference clock (S_REF) for outputting the output data content (S_OUT). In the prior art, an additional crystal oscillator 104 is used to generate the oscillation reference clock, as shown in FIG. 1, which is inaccurate, complicated and high cost. The transceiver system 200 having frequency and phase detector extracts a clock signal (S_CLK) by receiving an external signal (S_EXT) to simplify the circuit design of the transceiver system 200 and save the manufacturing cost.

Figure 3:
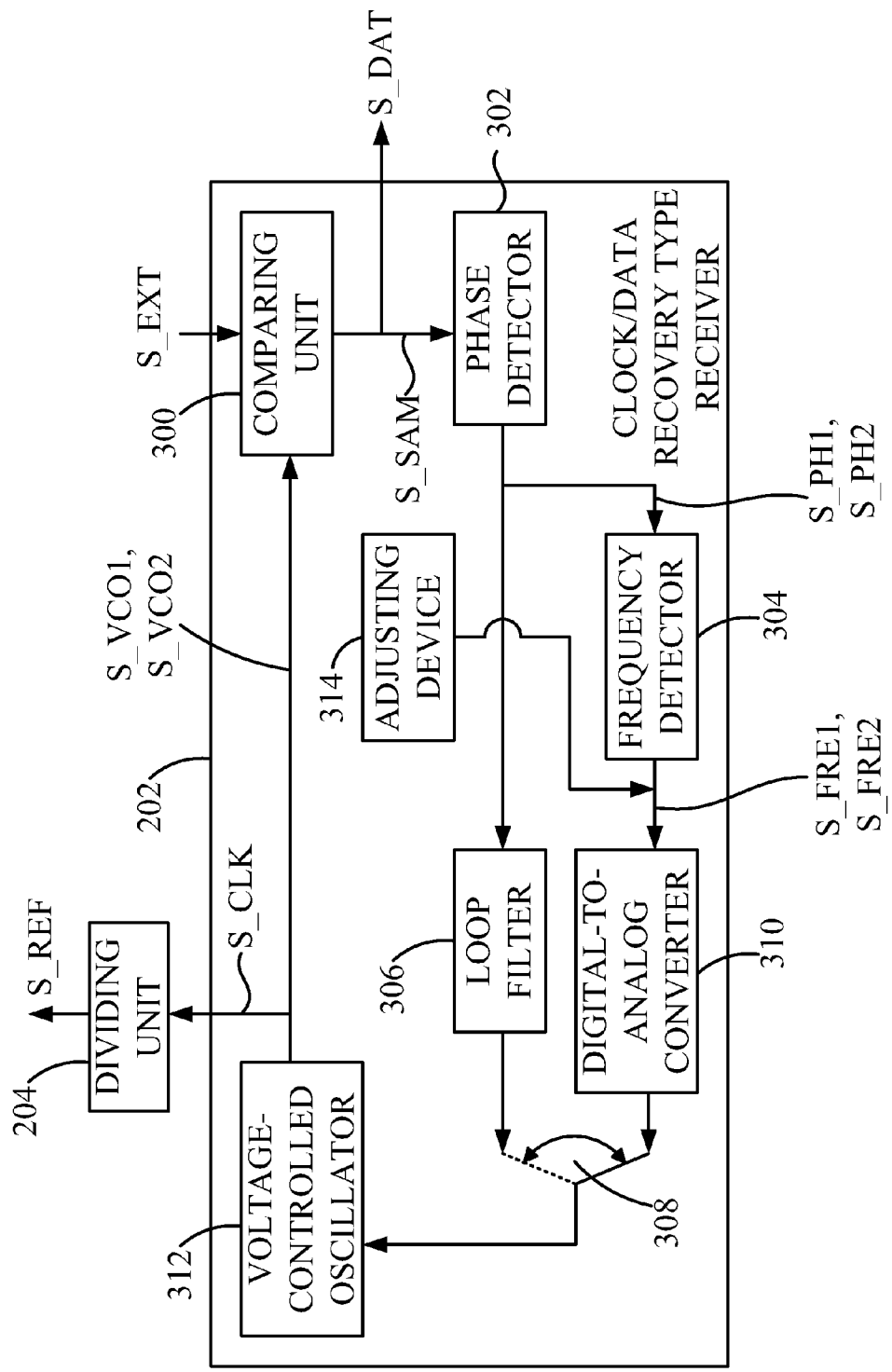
FIG. 3 is a schematic detailed block diagram of a clock/data recovery type receiver shown in FIG. 2 according to one embodiment of the present invention.

Please refer to FIG. 2 and FIG. 3. FIG. 3 is a schematic detailed block diagram of a clock/data recovery type receiver 202 shown in FIG. 2 according to one embodiment of the present invention. The clock/data recovery type receiver 202 further includes a comparing unit 300, a phase detector 302, a frequency detector 304, a loop filter 306, a switching unit 308, a digital-to-analog converter (DAC) 310, a voltage-controlled oscillator (VCO) 312 and an adjusting device 314. The comparing unit 300 is coupled to the host unit 208 and the phase detector 302 is coupled to the comparing unit 300. The frequency detector 304 is coupled to the phase detector 302 and the loop filter 306 couples the phase detector 302 to the switching unit 308. The digital-to-analog converter (DAC) 310 couples the frequency detector 304 to the switching unit 308. The switching unit 308 selectively couples the loop filter 306 and the digital-to-analog converter (DAC) 310 to the voltage-controlled oscillator (VCO) 312. The voltage-controlled oscillator (VCO) 312 is coupled to the comparing unit 300, and the dividing unit 204 is coupled to the voltage-controlled oscillator (VCO) 312 and the comparing unit 300. The adjusting device 314 is coupled to the frequency detector 304.

The comparing unit 300 samples the external signal (S_EXT) based on a sampling frequency (S_SFRE) for generating the data signal (S_DAT) and a sampling signal (S_SAM). The phase detector 302 detects a phase variation between a first voltage-controlled oscillation signal (S_VCO1) and the sampling signal (S_SAM) for generating a first phase difference signal (S_PH1), and detects the phase variation between a second voltage-controlled oscillation signal (S_VCO2) and the sampling signal (S_SAM) for generating a second phase difference signal (S_PH2). The frequency detector 304 detects a frequency of the first phase difference signal (S_PH1) for generating a first frequency difference signal (S_FRE1). The frequency detector 304 further adjusts the first voltage-controlled oscillation signal (S_VCO1) (i.e. voltage-controlled oscillator (VCO) 312) for controlling the second voltage-controlled oscillation signal (S_VCO2) and the frequency detector 304 detects a frequency of the second phase difference signal (S_PH2) for generating a second frequency difference signal (S_FRE2).

The adjusting device 314 compares the first frequency difference signal (S_FRE1) with the second frequency difference signal (S_FRE2) wherein when the second frequency difference signal (S_FRE2) is smaller than the first frequency difference signal (S_FRE1), the second frequency difference signal (S_FRE2) is continuously decreased to a minimum frequency difference (S_FMIN), and when the second frequency difference signal (S_FRE2) is greater than the first frequency difference signal (S_FRE1), the first frequency difference signal (S_FRE1) is continuously decreased to the minimum frequency difference.

The voltage-controlled oscillator 312 generates the first voltage-controlled oscillation signal (S_VCO1) and generates the second voltage-controlled oscillation signal (S_VCO2) when the frequency detector 304 adjusts the frequency of the voltage-controlled oscillator 312 based on the first frequency difference signal (S_FRE1), wherein one of the first voltage-controlled oscillation signal (S_VCO1) and the second voltage-controlled oscillation signal (S_VCO2) is equalized to a transmitted frequency of the external signal (S_EXT) based on the first frequency difference signal (S_FRE1) and the second frequency difference signal (S_FRE2). In one embodiment, the voltage-controlled oscillator 312 directly issues the signal at a frequency of 10 GHz to the comparing unit 300 or issues the approximate transmitted frequency of external signal to the comparing unit 300. In another case, the sampling frequency or the approximate transmitted frequency with multi-phase is issued to the comparing unit 300 at a plurality of unit frequency, e.g. 1 GHz. The switching unit 308 is utilized to switch one of the frequency detector 304 and phase detector 302 to be electrically connected to the voltage-controlled oscillator 312.

The sampling signal (S_SFRE) of the comparing unit 300 is a multiple of the frequencies of the first voltage-controlled oscillation signal (S_VCO1) and the second voltage-controlled oscillation signal (S_VCO2), respectively. For example, a frequency multiplication unit (not shown) makes a frequency multiplication of the first voltage-controlled oscillation signal (S_VCO1) and the second voltage-controlled oscillation signal (S_VCO2) to generate the sampling frequency (S_SFRE) which is transmitted to the comparing unit 300. It should be noted that the clock signal (S_CLK) has a frequency synchronization with the reference clock (S_REF) wherein the frequency synchronization means that the clock signal's (S_CLK) frequency is approximately equal to the reference clock (S_REF) signal's frequency, or the clock signal's (S_CLK) frequency is a multiple of the reference clock (S_REF) signal's frequency or vice versa.

Figure 4:
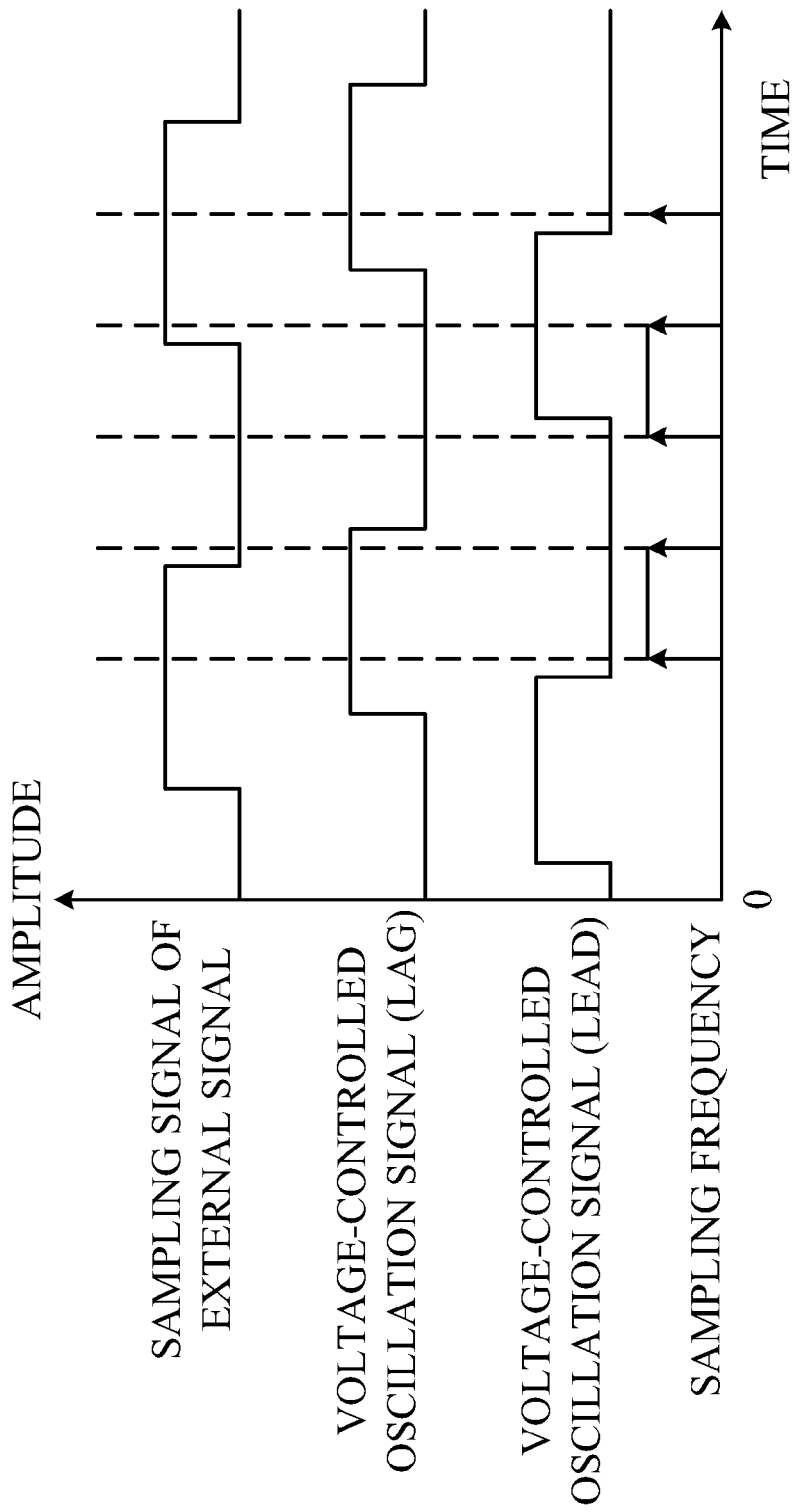
FIG. 4 is a schematic timing waveform profile of phase difference between the voltage-controlled oscillation signal and sampling signal according to one embodiment of the present invention.

Please refer to FIG. 3 and FIG. 4. FIG. 4 is a schematic timing waveform profile of phase difference between the voltage-controlled oscillation signal (S_VCO1, S_VCO2) and sampling signal (S_SAM) according to one embodiment of the present invention. The horizontal axis represents time and the vertical axis represents amplitude. The first phase difference signal (S_PH1) represents that the first voltage-controlled oscillation (S_VCO1) either leads or lags the sampling signal (S_SAM), and the second phase difference signal (S_PH2) represents that the second voltage-controlled oscillation (S_VCO2) either leads or lags the sampling signal (S_SAM). The sampling signal (S_SAM) is the signal that the external signal (S_EXT) is sampled by the sampling frequency (S_SFRE). In one embodiment, the sampling frequency (S_SFRE) is double frequency of one of the first voltage-controlled oscillation signal (S_VCO1) and the second voltage-controlled oscillation signal (S_VCO2).

Figure 5:
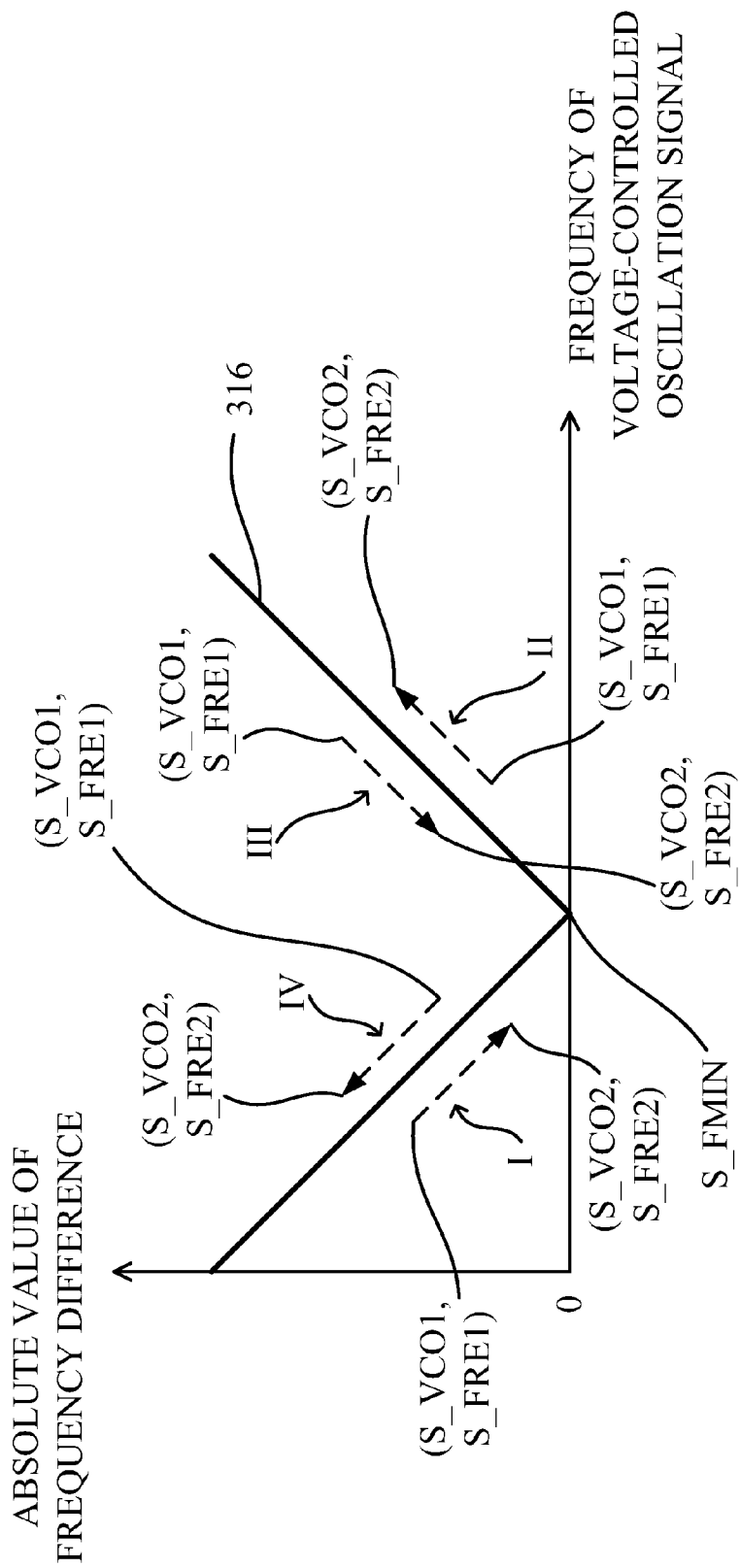
FIG. 5 is a schematic waveform profile when an adjusting device adjusts the frequency of a frequency detector according to one embodiment of the present invention.

Please refer to FIG. 3 and FIG. 5. FIG. 5 is a schematic waveform profile 316 when an adjusting device 314 adjusts the frequency of a frequency detector 304 according to one embodiment of the present invention. The horizontal axis represents the frequency of voltage-controlled oscillation signal and the vertical axis represents the absolute value of frequency difference. Based on the waveform profile 316, the adjusting device 314 compares the first voltage-controlled oscillation signal (S_VCO1) and the second voltage-controlled oscillation signal (S_VCO2). When the second voltage-controlled oscillation signal (S_VCO2) is greater than the first voltage-controlled oscillation signal (S_VCO1) and if the second frequency difference signal (S_FRE2) is smaller than the first frequency difference signal (S_FRE1), the second frequency difference signal (S_FRE1) is continuously decreased to the minimum frequency difference (S_min) for equalizing the frequency of the second voltage-controlled oscillation signal (S_VCO2) to the transmitted frequency of the external signal (S_EXT), as arrow indication "I". The minimum frequency difference (S_min) represents that the voltage-controlled oscillation signals are locked to the transmitted frequency of the external signal (S_EXT). If the second frequency difference signal (S_FRE2) is greater than the first frequency difference signal (S_FRE1), the first frequency difference signal (S_FRE1) is continuously decreased to the minimum frequency difference (S_min) for equalizing the frequency of the first voltage-controlled oscillation signal (S_VCO1) to the transmitted frequency of the external signal (S_EXT), as arrow indication "II".

Based on the waveform profile 316, when the second voltage-controlled oscillation signal (S_VCO2) is smaller than the first voltage-controlled oscillation signal (S_VCO2) and if the second frequency difference signal (S_FRE2) is smaller than the first frequency difference signal (S_FRE1), the second frequency difference signal (S_VCO2) is continuously decreased to the minimum frequency difference (S_FMIN) for equalizing the frequency of the second voltage-controlled oscillation signal (S_VCO2) to the transmitted frequency of the external signal (S_EXT), as arrow indication "III". If the second frequency difference signal (S_FRE2) is greater than the first frequency difference signal (S_FRE1), the first frequency difference signal (S_FRE1) is continuously decreased to the minimum frequency difference (S_fnin) for equalizing the frequency of the first voltage-controlled oscillation signal (S_VCO1) to the transmitted frequency of the external signal (S_EXT), as arrow indication "IV".

Before the frequency detector 304 completes the frequency synchronization of the voltage-controlled oscillation signals (S_VCO1, S_VCO2) and the external signal (S_EXT), the switching unit 308 switches to the frequency detector 304. After the frequency detector 304 completes the frequency synchronization of the voltage-controlled oscillation signals (S_VCO1, S_VCO2) and the external signal (S_EXT), the switching unit 308 switches to the phase detector 302.

According to the above-mentioned descriptions, the absolute value of frequency difference between the voltage-controlled oscillation signals (S_VCO1, S_VCO2) and the external signal (S_EXT) is in a "loose" percentage value, e.g. ±10%, or more. Thus, the clock/data recovery type receiver 202 is capable of precisely adjusting the starting frequency of the voltage-controlled oscillation signal to an operable value and the external signal (S_EXT) is then extracted to generate the clock signal (S_CLK) and the data signal (S_DAT). After the frequency detector 304 makes a frequency synchronization of the voltage-controlled oscillation signals (S_VCO1, S_VCO2) and the external signal (S_EXT), the switching unit 308 switches from the frequency detector 304 to the phase detector 302. Therefore, the transceiver system 200 having the phase and frequency detector is capable of locking the frequency and phase of external signal (S_EXT) by the clock/data recovery type receiver 202. The transceiver system 200 further adjusts the frequency difference between the voltage-controlled oscillation signals (S_VCO1, S_VCO2) and the external signal (S_EXT) to an operable value for the receiver 202 to improve the usage flexibility of the transceiver system 200.

In the clock/data recovery type receiver 202, a loop filter 306 filters noises of the first phase difference signal (S_PH1) and the second phase difference signal (S_PH2). The digital-to-analog converter 310 converts the first frequency difference signal (S_FRE1) and the second frequency difference signal (S_FRE2). In one embodiment, the transceiver system 200 is coupled to the encoding/decoding device 212 for encoding and decoding the data signal (S_DAT) based on the reference clock (S_REF). The encoding/decoding device 212 is disposed in the processing circuit 212.

Figure 6A:
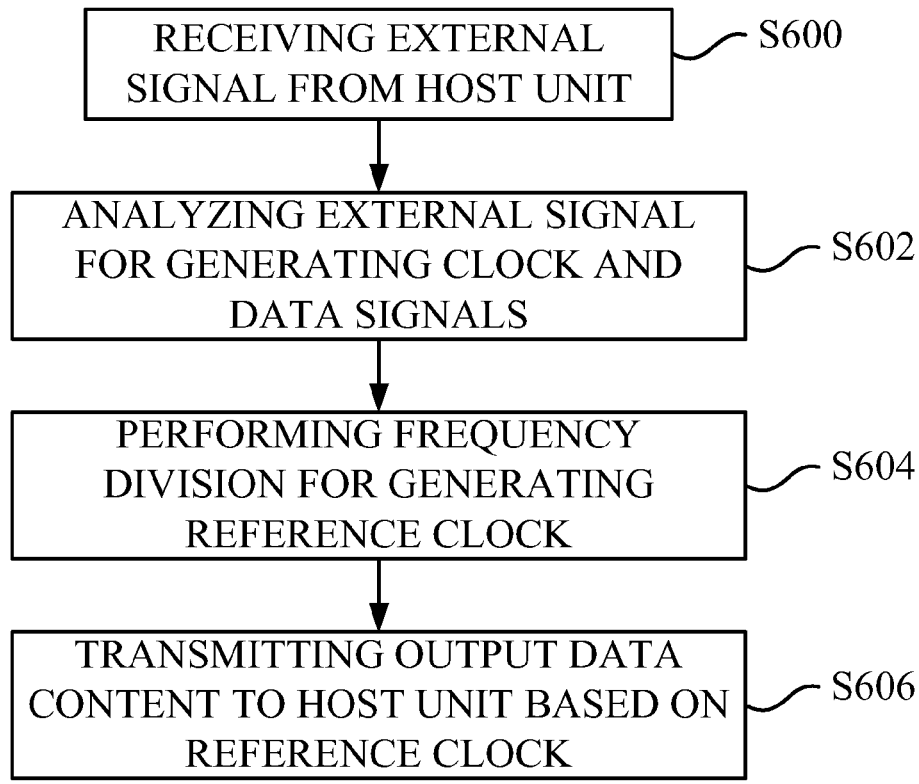
FIGS. 6A-6B are flow charts of transceiving method of the built-in reference clock according to one embodiment of the present invention.
Figure 6B:
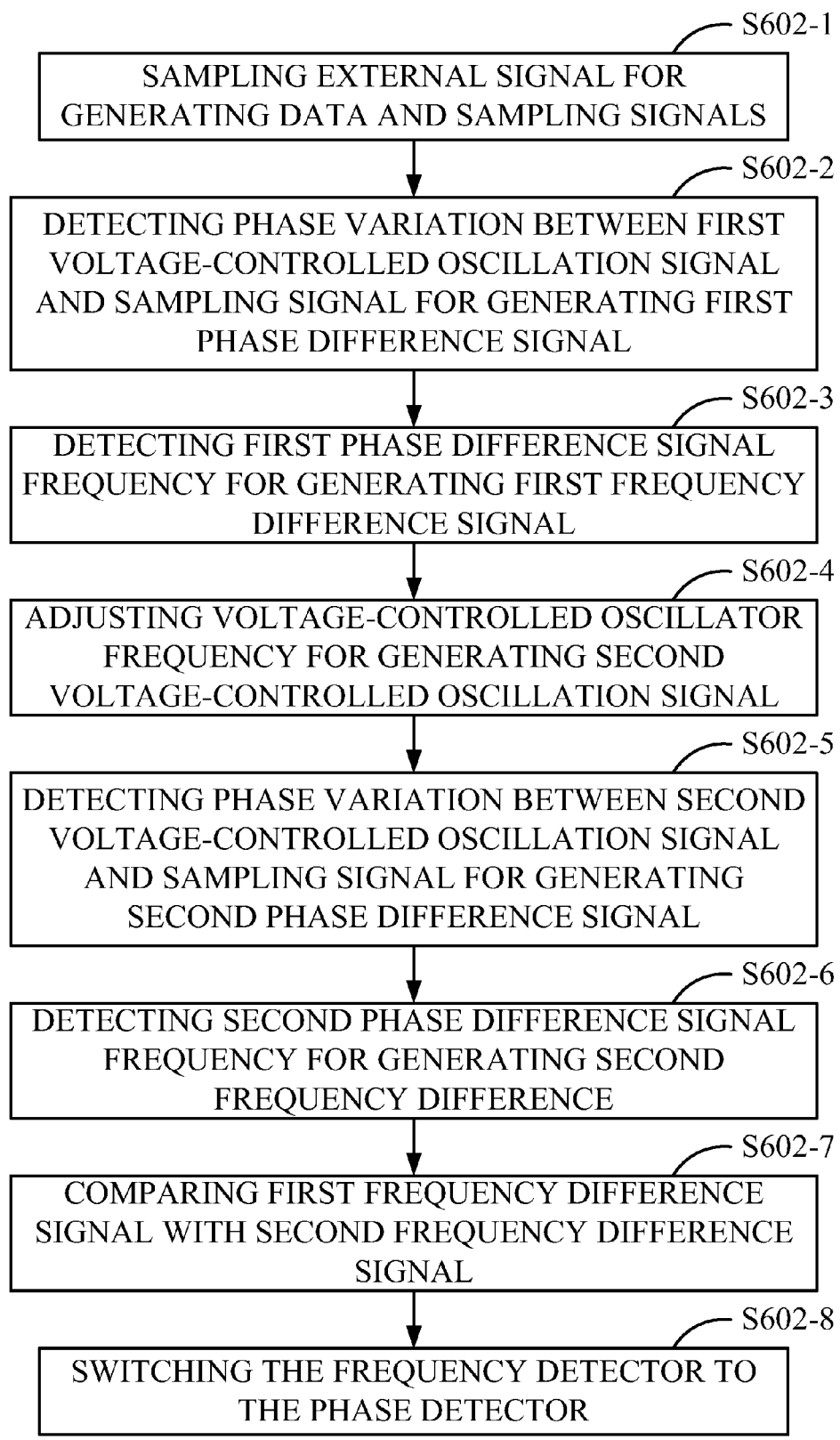

Please refer to FIG. 2, FIG. 3 and FIGS. 6A-6B. FIGS. 6A-6B are flow charts of transceiving method of the built-in reference clock according to one embodiment of the present invention. The transceiving method with frequency and phase detection for a transceiver system 200 connected to a host unit 208. The transceiver system 200 comprises a clock/data recovery type receiver 202, a dividing unit 204 and a transmitter 206 and the clock/data recovery type receiver 202 includes a comparing unit 300, a phase detector 302, a frequency detector 304, a voltage-controlled oscillator 312, an adjusting device 314 and a switching unit 308, the transceiving method comprises the following steps, as shown in FIG. 6A.

In step S600, a clock/data recovery type receiver 202 receives an external signal (S_EXT) from the host unit 208.

In step S602, a clock/data recovery type receiver 202 extracts the external signal (S_EXT) for generating a clock signal (S_CLK) and a data signal (S_DAT).

In step S604, a dividing unit 204 performs frequency division on the clock signal (S_CLK) for generating a reference clock (S_REF).

In step S606, a transmitter 206 transmits the output data content (S_OUT) to the host unit based on the reference clock (S_REF).

In step S602, further including the following steps, as shown in FIG. 6B:

In step S602-1, the external signal is sampled based on a sampling frequency by a comparing unit for generating the data signal and a sampling signal;

In step S602-2, a phase variation between a first voltage-controlled oscillation signal and the sampling signal is detected to generate a first phase difference signal by a phase detector;

In step S602-3, a frequency of the first phase difference signal is detected to generate a first frequency difference signal by a frequency detector.

In step S602-4, the frequency of the voltage-controlled oscillator based on the first frequency difference signal is adjusted to generate a second voltage-controlled oscillation signal by the frequency detector.

In step S602-5, the phase variation between a second voltage-controlled oscillation signal and the sampling signal is detected to generate a second phase difference signal by the phase detector.

In step S602-6, a frequency of the second phase difference signal is detected to generate a second frequency difference signal by the frequency detector.

In step S602-7, the first frequency difference signal is compared with the second frequency difference signal wherein when the second frequency difference signal is smaller than the first frequency difference signal, the second frequency difference signal is continuously decreased to a minimum frequency difference, and when the second frequency difference signal is greater than the first frequency difference signal, the first frequency difference signal is continuously decreased to the minimum frequency difference, as the waveform profile shown in FIG. 5.

In step S602-7, the first voltage-controlled oscillation signal is compared with the second voltage-controlled oscillation signal, wherein when the second voltage-controlled oscillation signal is greater than the first voltage-controlled oscillation signal, if the second frequency difference signal is smaller than the first frequency difference signal, the second frequency difference signal is continuously decreased to the minimum frequency difference for equalizing the frequency of the second voltage-controlled oscillation signal to the transmitted frequency of the external signal, and if the second frequency difference signal is greater than the first frequency difference signal, the first frequency difference signal is continuously decreased to the minimum frequency difference for equalizing the frequency of the first voltage-controlled oscillation signal to the transmitted frequency of the external signal, and wherein when the second voltage-controlled oscillation signal is smaller than the first voltage-controlled oscillation signal; if the second frequency difference signal is smaller than the first frequency difference signal, the second frequency difference signal is continuously decreased to the minimum frequency difference for equalizing the frequency of the second voltage-controlled oscillation signal to the transmitted frequency of the external signal, and if the second frequency difference signal is greater than the first frequency difference signal, the first frequency difference signal is continuously decreased to the minimum frequency difference for equalizing the frequency of the first voltage-controlled oscillation signal to the transmitted frequency of the external signal.

In step S602-8, the frequency detector is switched to the phase detector by the switching unit and adjusting the phase of the voltage-controlled signal based on the second phase difference signal for equalizing the phase of the voltage-controlled signal to the phase of the sampling signal.

In one embodiment, the first phase difference signal (S_PH1) represents that the first voltage-controlled oscillation (S_VCO1) either leads or lags the sampling signal (S_SAM), and the second phase difference signal (S_PH2) represents that the second voltage-controlled oscillation (S_VCO2) either leads or lags the sampling signal (S_SAM). The sampling signal (S_SAM) is the signal that the external signal (S_EXT) is sampled by the sampling frequency (S_SFRE). In one embodiment, the sampling frequency (S_SFRE) is double frequency of one of the first voltage-controlled oscillation signal (S_VCO1) and the second voltage-controlled oscillation signal (S_VCO2), as shown in FIG. 4.

The transceiver system having phase and frequency detector and method thereof for extracting a clock signal of the external signal for simplifying the circuit design of the transceiver system. The transceiver system having phase and frequency detector and method thereof locks a frequency and phase of the external signal by a receiver so that the absolute value of frequency difference between the voltage-controlled oscillation signals and the external signal is in a loose range and the clock/data recovery type receiver is capable of adjusting the starting frequency precision of the voltage-controlled oscillation signal to an operable range for extracting the external signal.

As is understood by a person skilled in the art, the foregoing preferred embodiments of the present invention are illustrative rather than limiting of the present invention. It is intended that they cover various modifications and similar arrangements be included within the spirit and scope of the appended claims, the scope of which should be accorded the broadest interpretation so as to encompass all such modifications and similar structure.

What is claimed is:

1. A transceiver system coupled to a host unit, the transceiver system comprising:
    a clock/data recovery type receiver, receiving an external signal from the host unit and extracting the external signal for generating a clock signal and a data signal;
    a dividing unit coupled to the clock/data recovery type receiver, performing frequency division of the clock signal for generating a reference clock;
    a transmitter coupled to the dividing unit, transmitting output data content to the host unit based on the reference clock;
    a comparing unit, sampling the external signal based on a sampling frequency for generating the data signal and a sampling signal;
    a phase detector coupled to the comparing unit, detecting a phase variation between a first voltage-controlled oscillation signal and the sampling signal for generating a first phase difference signal, and detecting a phase variation between a second voltage-controlled oscillation signal and the sampling signal for generating a second phase difference signal;
    a frequency detector coupled to the phase detector, detecting a frequency of the first phase difference signal for generating a first frequency difference signal, and detecting a frequency of the second phase difference signal for generating a second frequency difference signal;
    a voltage-controlled oscillator, generating the first voltage-controlled oscillation signal and generating the second voltage-controlled oscillation signal when the frequency detector adjusts the frequency of the voltage-controlled oscillator based on the first frequency difference signal, wherein one of the first voltage-controlled oscillation signal and the second voltage-controlled oscillation signal is equalized to a transmitted frequency of the external signal based on the first frequency difference signal and the second frequency difference signal; and
    a switching unit, switching one of the frequency detector and the phase detector to be electrically connected to the voltage-controlled oscillator.

2. The transceiver system of claim 1, wherein the first phase difference signal represents that the first voltage-controlled oscillation signal either leads or lags the sampling signal, and the second phase difference signal represents that the second voltage-controlled oscillation signal either leads or lags the sampling signal.

3. The transceiver system of claim 1, further comprising an adjusting device coupled to the frequency detector, comparing the first frequency difference signal with the second frequency difference signal, wherein when the second frequency difference signal is smaller than the first frequency difference signal, the second frequency difference signal is continuously decreased to a minimum frequency difference, and when the second frequency difference signal is greater than the first frequency difference signal, the first frequency difference signal is continuously decreased to the minimum frequency difference.

4. The transceiver system of claim 3, wherein the adjusting device compares the first voltage-controlled oscillation signal and the second voltage-controlled oscillation signal, wherein when the second voltage-controlled oscillation signal is greater than the first voltage-controlled oscillation signal, if the second frequency difference signal is smaller than the first frequency difference signal, the second frequency difference signal is continuously decreased to the minimum frequency difference for equalizing the frequency of the second voltage-controlled oscillation signal to the transmitted frequency of the external signal, and if the second frequency difference signal is greater than the first frequency difference signal, the first frequency difference signal is continuously decreased to the minimum frequency difference for equalizing the frequency of the first voltage-controlled oscillation signal to the transmitted frequency of the external signal, and wherein when the second voltage-controlled oscillation signal is smaller than the first voltage-controlled oscillation signal, if the second frequency difference signal is smaller than the first frequency difference signal, the second frequency difference signal is continuously decreased to the minimum frequency difference for equalizing the frequency of the second voltage-controlled oscillation signal to the transmitted frequency of the external signal, and if the second frequency difference signal is greater than the first frequency difference signal, the first frequency difference signal is continuously decreased to the minimum frequency difference for equalizing the frequency of the first voltage-controlled oscillation signal to the transmitted frequency of the external signal.

5. The transceiver system of claim 1, wherein the clock/data recovery type receiver further comprises a loop filter coupled to the phase detector and the switching unit, filtering noises of the first phase difference signal and the second phase difference signal.

6. The transceiver system of claim 1, wherein the clock/data recovery type receiver further comprises a digital-to-analog converter coupled to the frequency detector and the switching unit, converting the first frequency difference signal and the second frequency difference signal.

7. The transceiver system of claim 1, wherein the sampling signal of the comparing unit has a frequency multiple of the first voltage-controlled oscillation signal and the second voltage-controlled oscillation signal, respectively.

8. The transceiver system of claim 1, further comprising an encoding/decoding device, encoding and decoding the data signal based on the reference clock.

9. The transceiver system of claim 1, wherein the clock signal has a frequency synchronization with the reference clock.

10. A transceiving method having frequency and phase detection which is suitable for a transceiver system connected to a host unit, wherein the transceiver system comprises a clock/data recovery type receiver, a dividing unit and a transmitter and the clock/data recovery type receiver comprises a comparing unit, a phase detector, a frequency detector, a voltage-controlled oscillator and a switching unit, the transceiving method comprises the steps of:
    (a) receiving an external signal from the host unit by the clock/data recovery type receiver;
    (b) extracting the external signal for generating a clock signal and a data signal by the clock/data recovery type receiver, during the step (b), further comprising the steps of:

(b1) sampling the external signal based on a sampling frequency by the comparing unit for generating the data signal and a sampling signal;

(b2) detecting a phase variation between a first voltage-controlled oscillation signal and the sampling signal by the phase detector for generating a first phase difference signal;

(b3) detecting a frequency of the first phase difference signal by the frequency detector for generating a first frequency difference signal;

(b4) adjusting the frequency of the voltage-controlled oscillator based on the first frequency difference signal by the frequency detector for generating a second voltage-controlled oscillation signal;

(b5) detecting the phase variation between a second voltage-controlled oscillation signal and the sampling signal by the phase detector for generating a second phase difference signal;

(b6) detecting a frequency of the second phase difference signal by the frequency detector for generating a second frequency difference signal; and (b7) comparing the first frequency difference signal with the second frequency difference signal, wherein when the second frequency difference signal is smaller than the first frequency difference signal, the second frequency difference signal is continuously decreased to a minimum frequency difference, and when the second frequency difference signal is greater than the first frequency difference signal the first frequency difference signal is continuously decreased to the minimum frequency difference;

(c) performing frequency division on the clock signal for generating a reference clock by the dividing unit; and (d) transmitting output data content to the host unit based on the reference clock by the transmitter.

11. The transceiving method of claim 10, wherein the first phase difference signal represents that the first voltage-controlled oscillation signal either leads or lags the sampling signal, and the second phase difference signal represents that the second voltage-controlled oscillation signal either leads or lags the sampling signal.

12. The transceiving method of claim 10, during the step (b7), further comprising a step (b7-1) of: comparing the first voltage-controlled oscillation signal and the second voltage-controlled oscillation signal, wherein when the second voltage-controlled oscillation signal is greater than the first voltage-controlled oscillation signal, if the second frequency difference signal is smaller than the first frequency difference signal, the second frequency difference signal is continuously decreased to the minimum frequency difference for equalizing the frequency of the second voltage-controlled oscillation signal to the transmitted frequency of the external signal, and if the second frequency difference signal is greater than the first frequency difference signal, the first frequency difference signal is continuously decreased to the minimum frequency difference for equalizing the frequency of the first voltage-controlled oscillation signal to the transmitted frequency of the external signal, and wherein when the second voltage-controlled oscillation signal is smaller than the first voltage-controlled oscillation signal, if the second frequency difference signal is smaller than the first frequency difference signal, the second frequency difference signal is continuously decreased to the minimum frequency difference for equalizing the frequency of the second voltage-controlled oscillation signal to the transmitted frequency of the external signal, and if the second frequency difference signal is greater than the first frequency difference signal, the first frequency difference signal is continuously decreased to the minimum frequency difference for equalizing the frequency of the first voltage-controlled oscillation signal to the transmitted frequency of the external signal.

13. The transceiving method of claim 10, after the step (b7), further comprising a step (b8) of: switching the frequency detector to the phase detector by the switching unit and adjusting a phase of the voltage-controlled signal based on the second phase difference signal for equalizing the phases of the first and second voltage-controlled signals to the phase of the sampling signal.

14. The transceiving method of claim 10, wherein the sampling signal of the comparing unit is the frequency multiples of the first voltage-controlled oscillation signal and the second voltage-controlled oscillation signal.

15. The transceiving method of claim 10, wherein the clock signal has a frequency synchronization with the reference clock.

* * * * *